(12) United States Patent
Okada

(10) Patent No.: US 9,341,353 B2
(45) Date of Patent: May 17, 2016

(54) LIGHT EMITTING DEVICE

(71) Applicant: NICHIA CORPORATION, Anan-shi (JP)

(72) Inventor: Satoshi Okada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 99 days.

(21) Appl. No.: 14/011,702

(22) Filed: Aug. 27, 2013

(65) Prior Publication Data

US 2013/0343067 A1    Dec. 26, 2013

Related U.S. Application Data

(63) Continuation of application No. PCT/JP2012/054627, filed on Feb. 24, 2012.

(30) Foreign Application Priority Data

Feb. 28, 2011   (JP) ................. 2011-042638

(51) Int. Cl.
*H01L 33/48* (2010.01)
*F21V 21/00* (2006.01)
*H01L 33/62* (2010.01)
*H01L 33/60* (2010.01)
*H01L 33/64* (2010.01)
*H01L 23/00* (2006.01)

(52) U.S. Cl.
CPC ................ *F21V 21/00* (2013.01); *H01L 33/62* (2013.01); *H01L 24/73* (2013.01); *H01L 33/486* (2013.01); *H01L 33/60* (2013.01); *H01L 33/647* (2013.01); *H01L 2224/32245* (2013.01); *H01L 2224/48091* (2013.01); *H01L 2224/48247* (2013.01); *H01L 2224/73265* (2013.01); *H01L 2924/01322* (2013.01); *H01L 2924/12044* (2013.01)

(58) Field of Classification Search
None
See application file for complete search history.

(56) References Cited

U.S. PATENT DOCUMENTS

| | | |
|---|---|---|
| 2001/0022390 A1 | 9/2001 | Waitl et al. |
| 2005/0280017 A1 | 12/2005 | Oshio et al. |
| 2006/0091406 A1 | 5/2006 | Kaneko et al. |

(Continued)

FOREIGN PATENT DOCUMENTS

| | | |
|---|---|---|
| CN | 1292154 | 4/2001 |
| CN | 201430613 | 3/2010 |

(Continued)

OTHER PUBLICATIONS

International Search Report for corresponding International Application No. PCT/JP2012/054627, Mar. 19, 2012.

(Continued)

*Primary Examiner* — Robert Bachner
*Assistant Examiner* — Molly Reida
(74) *Attorney, Agent, or Firm* — Mori & Ward, LLP

(57) ABSTRACT

A light emitting device includes a package and a light emitting element. The package includes a resin portion and at least one lead frame arranged in the resin portion. The at least one lead frame has at least one protrusion which is surrounded by the resin portion and which has an upper surface exposed from the resin portion. The light emitting element is mounted on the upper surface of the at least one protrusion and is electrically connected to the at least one lead frame. At least a half area of the upper surface is covered with the light emitting element.

16 Claims, 9 Drawing Sheets

(56) References Cited

U.S. PATENT DOCUMENTS

| | | |
|---|---|---|
| 2008/0230790 A1 | 9/2008 | Seko et al. |
| 2008/0258156 A1 | 10/2008 | Hata |
| 2009/0309201 A1 | 12/2009 | Morita |
| 2011/0037091 A1 | 2/2011 | Fushimi |
| 2011/0074000 A1 | 3/2011 | Jaeger et al. |
| 2011/0133232 A1 | 6/2011 | Yoshioka et al. |
| 2013/0009190 A1* | 1/2013 | Memida .................... 257/98 |
| 2013/0043501 A1 | 2/2013 | Kobayakawa et al. |
| 2013/0049058 A1 | 2/2013 | Kobayakawa |

FOREIGN PATENT DOCUMENTS

| | | |
|---|---|---|
| JP | 2002-520823 | 7/2002 |
| JP | 2005-353914 | 12/2005 |
| JP | 2006-134996 | 5/2006 |
| JP | 2006-303039 | 11/2006 |
| JP | 2007-180066 | 7/2007 |
| JP | 2008-109098 | 5/2008 |
| JP | 2008-235826 | 10/2008 |
| JP | EP 2112700 A2 * | 10/2009 ............ H01L 33/486 |
| JP | 2010-135718 | 6/2010 |
| TW | 201005901 | 2/2010 |
| WO | WO 2009/130957 | 10/2009 |
| WO | WO 2009/143789 | 12/2009 |
| WO | WO 2011/125346 | 10/2011 |
| WO | WO 2011/136356 | 11/2011 |
| WO | WO 2011/136357 | 11/2011 |

OTHER PUBLICATIONS

Japanese Office Action for corresponding JP Application No. 2013-502296, Aug. 4, 2015.

Chinese Office Action for corresponding CN Application No. 201280010632.5, Oct. 9, 2015.

* cited by examiner

LIGHT EMITTING DEVICE

CROSS-REFERENCE TO RELATED APPLICATIONS

The present application is a continuation application of PCT Application No. PCT/JP2012/054627, filed Feb. 24, 2012, which claims priority to Japanese Patent Application No. 2011-042638, filed Feb. 28, 2011. The contents of these applications are incorporated herein by reference in their entireties.

BACKGROUND OF THE INVENTION

1. Field of the Invention

The present invention relates to a light emitting device.

2. Description of the Related Art

Light emitting devices using light emitting diodes (LED), laser diodes (LD) and the like have a small size with a high luminous efficiency, and can emit bright light. Further, such devices have excellent initial performance and high durability to repetitive operations of turning on and off. Accordingly, light emitting devices employing a light emitting element are used as various light sources.

In such light emitting devices, light emitted from the light emitting element is needed to be efficiently reflected in a desired predetermined direction. For this reason, many light emitting devices have a structure, for example as shown in JP2005-353914A (see FIG. 1 and FIG. 2 disclosed in JP2005-353914A), in which a recess (cavity) is formed in a package or the like, defined by side walls made of a resin or the like and a bottom surface where a lead frame made of a metal is arranged with a resin portion, and a light emitting element is arranged on the lead frames in the recess. With such a structure, in addition to the light from the light emitting element directly reaching the upper plane of the recess, the light emitted from the light emitting element and reflected by the side walls or the bottom surface of the recess can be emitted outside of the light emitting device, and thus the power efficiency (luminous efficiency) can be enhanced.

As for a structure in which the metal frame is exposed in a smaller area at the bottom surface of the recess, JP2002-520823A (for example see FIG. 3 disclosed in JP2002-520823A) discloses a light emitting device in which a lead frame having an even thickness is bent to form a protruding portion (a bent protruding portion) on the upper surface of the lead frame, and the light emitting element is mounted on the protruding portion while portions of the upper surface of the lead frame other than the protruding portion is covered with a resin so as not to be exposed from the bottom surface of the recess.

SUMMARY OF THE INVENTION

A light emitting device according to an aspect includes a package and a light emitting element. The package includes a resin portion and at least one lead frame arranged in the resin portion. The at least one lead frame has at least one protrusion which is surrounded by the resin portion and which has an upper surface exposed from the resin portion. The light emitting element is mounted on the upper surface of the at least one protrusion and is electrically connected to the at least one lead frame. At least a half area of the upper surface is covered with the light emitting element.

A light emitting device according to another aspect includes a package including a resin portion and at least one lead frame arranged in the resin portion; and a light emitting element electrically connected to at least one of the lead frames, and disposed on an element mounting surface of the package; wherein at least one lead frame comprises at least two protrusions on its upper surface, a resin which forms the element mounting surface is contained between the at least two protrusions; the at least one protrusions has an upper surface exposed from the resin on the element mounting surface; and the light emitting element is disposed on the upper surface of the protrusion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF EMBODIMENTS

Figure 1:
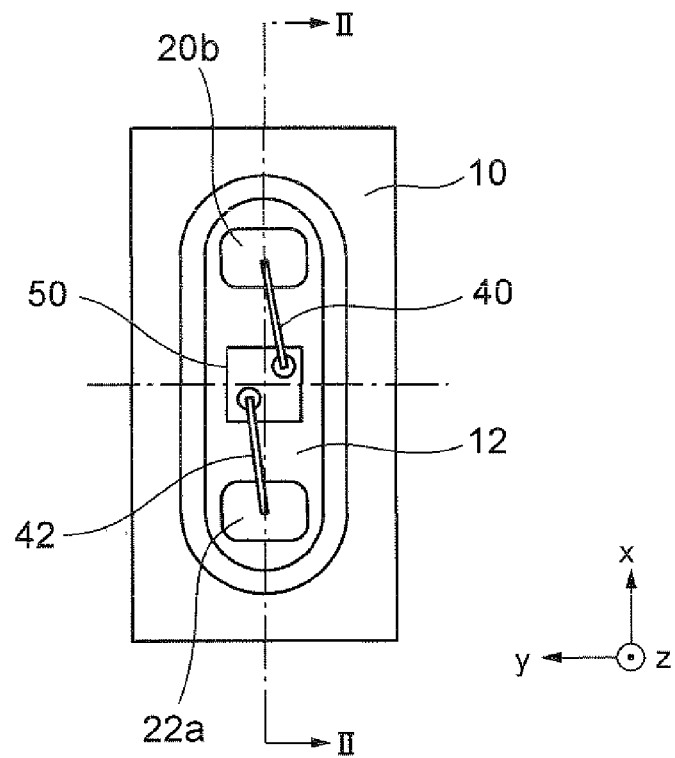
FIG. 1 is a plan view of a light emitting device 100 according to the present embodiment.

According to one aspect of the present embodiment, a light emitting device includes a package which includes a resin portion and at least one lead frame arranged in the resin portion and a light emitting element electrically connected to the at least one lead frame. The at least one lead frame has at least one protrusion on its upper surface. The at least one protrusion has side surfaces surrounded with the resin portion and an upper surface of the protrusion which is the upper surface of the lead frame is exposed from the resin portion, and the light emitting element is mounted on the upper surface of the protrusion, and at least a half area of the upper surface of the protrusion is covered with the light emitting element.

The light emitting device includes, although the details will be described later, at least one lead frame having at least one protrusion on an upper surface. The at least one protrusion is exposed from the resin portion, and on the exposed protrusion, a light emitting element is mounted, where appropriate, via a eutectic alloy or paste which has adhesion. Also, at least a half area of the upper surface of the protrusion is covered with the light emitting element.

As described above, covering of at least a half area of the upper surface of the protrusion with the light emitting element allows reduction of the exposure of the lead frame which has a low reflectance, and thus, a high reflectance can be obtained. Meanwhile, heat generated by the light emitting element can be spread into the entire lead frame through the protrusion located directly under the light emitting element, so that the heat can be easily absorbed by the lead frame and thereafter released to outside of the light emitting device.

The light emitting device is provided such that a light emitting element has an area of a bottom surface of the light emitting element is 50% to 150% with respect to the area of the upper surface of the protrusion.

The light emitting device is provided such that a longitudinal length and a lateral length of the bottom surface of the light emitting element are respectively in a range of plus and minus 0.1 mm with respect to a longitudinal length and a lateral length of the upper surface of the protrusion.

The light emitting device is provided such that the upper surface of a protrusion has a shape with rounded corners.

The light emitting device is provided such that the upper surface of the protrusion has a smaller area than the bottom surface of the light emitting element, and at the upper surface of the protrusion, the light emitting element is mounted with its circumference outside of a circumference of the upper surface of the protrusion.

The light emitting device is provided such that the area of the upper surface of the protrusion is equal to the area of the bottom surface of the light emitting device.

The light emitting device is provided such that on the mounting surface for the light emitting element, the upper surface of the protrusion is protruding from the surface of the resin portion.

The light emitting device is provided such that on the lower surface of the lead frame, a portion of the protrusion directly under the light emitting element is exposed from the resin portion.

The light emitting device is provided such that the resin portion includes a recess and the mounting surface for the light emitting element is the bottom surface of the recess.

The light emitting device is provided such that the lead frame has at least two protrusions and a resin of the resin portion is filled between the at least two protrusions.

According to another aspect of the present embodiment, the light emitting device is provided such that, a package includes a resin portion and at least one lead frame arranged in the resin portion, and a light emitting element electrically connected to at least one of the lead frames and arranged on an element mounting surface of the package, in which at least one lead frame includes at least two protrusions on its upper surface, a resin which forms the element mounting surface is contained between the at least two protrusions, the at least one protrusion has an upper surface exposed from the resin on the element mounting surface, and the light emitting element is mounted on the upper surface of the protrusion.

The light emitting device includes, although the details will be described later, at least one lead frame having at least two protrusions on an upper surface. Further, a resin forming a part of the element mounting surface (for example the recess of the package) of the package is arranged (entered) in the gap between the two protrusions. Further, the at least one protrusion is exposed from the resin portion at the element mounting surface where the light emitting element to be mounted, and on the exposed protrusion, a light emitting element is mounted, where appropriate, via a eutectic alloy or paste which has adhesion. Accordingly, the surface of the resin portion serves as the light-reflecting surface for reflecting the light from the light emitting element.

As described above, the resin is entered in the gap between the two protrusions, so that at the element mounting surface where the light emitting element is arranged, exposure of the lead frame which has a low reflectance can be reduced, and thus a high reflectance can be obtained. Meanwhile, the two protrusions are connected with each other in the resin portion, so that the heat generated by the light emitting element can be spread into the entire lead frame which includes the other protrusions through the protrusion which locates directly under the light emitting element, and is easily absorbed by the lead frame, and thereafter released to outside of the light emitting device.

The light emitting device is provided such that the resin portion has a recess and the element mounting surface is the bottom surface defining the recess, and a connecting portion between side surfaces of the recess and the bottom surface of the recess is located at an upper part between the at least two protrusions.

The light emitting device is provided such that at least one of the lead frames has at least two protrusions having upper surfaces exposed from the resin portion at the element mounting surface, the light emitting element is mounted on one of the two protrusions, and a wire electrically connected to the light emitting element is connected to the other protrusion.

In the light emitting device according to the present embodiment, at the element mounting surface of the package where the light emitting element to be arranged, exposure of the lead frame can be easily reduced and the reflectance can be improved, and accordingly, high power efficiency can be achieved. Further, heat generated by the light emitting element can be easily released.

Hereinafter, embodiments will be described in detail with reference to the drawings. In the following, terms indicating a specific direction or a position (for example, "upper", "below", "right", and "left" and other terms including those terms) may be used in the following when it is appropriate. But the use of these terms is for the ease of understanding of the present embodiment with reference to the accompanying drawings, and the scope of the present embodiment is not to be limited by the commonly accepted definitions of such terms. Further, in the description below, identical members or members of the same quality are assigned the same names and reference numerals.

Figure 2:
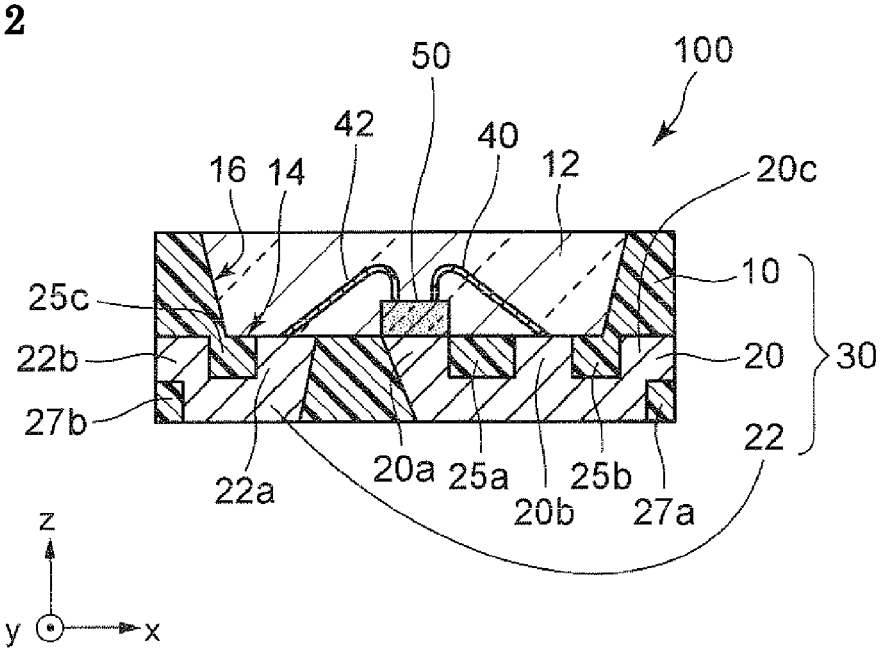
FIG. 2 is a cross-sectional view showing a cross section taken along line II-II of FIG. 1.
Figure 3:
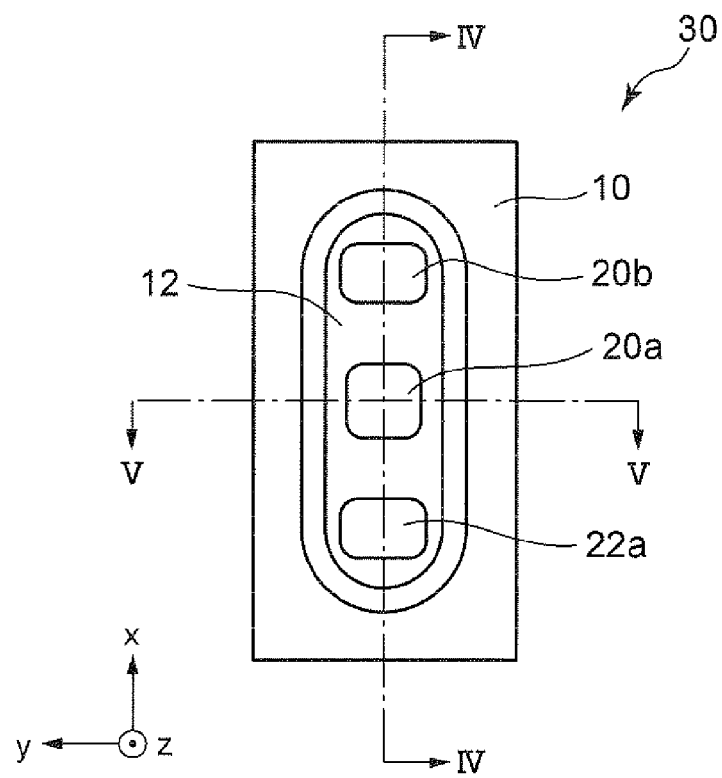
FIG. 3 is a plan view showing a package 30 of the light emitting device 100.
Figure 4:
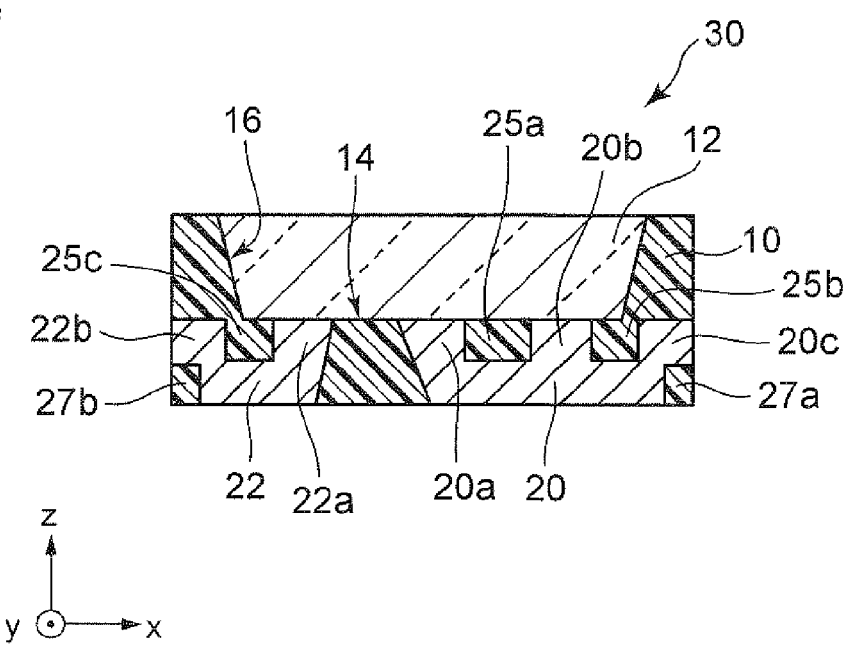
FIG. 4 is a cross-sectional view showing a cross section taken along line IV-IV of FIG. 3.
Figure 5:
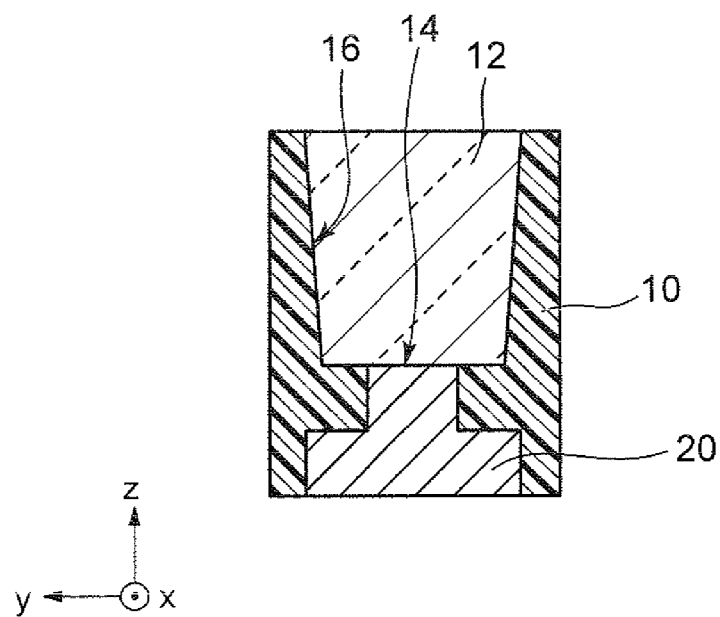
FIG. 5 is a cross-sectional view showing a cross section taken along line V-V of FIG. 3.

FIG. 1 is a plan view of a light emitting device 100 according to the present embodiment, and FIG. 2 is a cross-sectional view showing a cross section taken along line II-II of FIG. 1. FIG. 3 is a plan view of the light emitting device 100 shown in FIG. 1, in which, for easy understanding, the light emitting element 50 and the wires 40, 42 are omitted. That is, FIG. 3 is a plan view of the package 30 of the light emitting device 100. FIG. 4 is a cross-sectional view showing a cross section taken along line IV-IV of FIG. 3 and FIG. 5 is a cross-sectional view showing a cross section taken along line V-V of FIG. 3.

The package 30 includes a resin portion (package main body) 10 having a recess (cavity) 12 in its upper surface, at least one lead frame located in the resin portion 10 and also at least a part of it being located under (directly under) the recess 12. In the embodiments shown in FIG. 1 and FIG. 3, two lead frames of the lead frames 20, 22 are employed. The light emitting device 100 further includes a light emitting element 50 arranged on the lead frame 20 in the recess 12. The light emitting element 50 is electrically connected to at least one lead frame, where appropriate via a wire, and in the embodiments shown in FIG. 1 and FIG. 3, the light emitting element 50 is connected to the lead frame 20 via the wire 40, and is connected to the lead frame 22 via the wire 42. The recess 12 is preferably filled with a sealing material which to be described in detail later. The light emitting device 100 having such a structure and an effect as described above will be described in detail below.

1: Light Emitting Device

Lead Frame 20

The upper surface of the lead frame 20 arranged in the resin portion 10 has at least one (for example, the protrusion 20a which will be described in detail later), preferably at least two protrusions. In the embodiments shown in FIG. 1 to FIG. 5, three protrusions (for example the portions having a thickness increasing in the z-direction) 20a, 20b, and 20c. The protrusion 20a and the protrusion 20b are located under the bottom surface 14 of the recess 12 of the resin portion 10. That is, in the light emitting device 100, at least one of the protrusions is located under (directly under) the bottom surface 14 of the recess 12 of the resin portion 10. Further, the upper surface (may be referred to as "top surface") of the protrusion 20a is not covered with the resin of the resin portion 10, in other words, is exposed from the resin portion 10 at the bottom surface 14 of the recess 12. Preferably, as shown in the figures, the upper surface (top surface) of the protrusion 20b is also exposed from the bottom surface 14 of the resin portion at the element mounting surface. In the specification, the term "bottom surface 14" means in addition to the portion made of a resin which constitutes the resin portion 10, the upper surface (in the embodiments shown in FIG. 3 and FIG. 4, in addition to the upper surface of the protrusion 20a and the upper surface of the protrusion 20b of the lead frame, includes the upper surface of the protrusion 22a of the lead frame 22 which to be described in detail later) of the protrusion exposed from the resin portion 10. In addition, the bottom surface 14 corresponds to the element mounting surface where the light emitting element 50 to be arranged.

On the upper surface of the protrusion 20a exposed from the bottom surface 14 of the resin portion 10, a light emitting element 50 is mounted (that is, the upper surface of the protrusion 20a functions as a light emitting element mounting pattern). The light emitting element 50 may be fixed by using a eutectic bonding using an Au—Sn alloy or by using a paste such as a silicone paste, a silver paste or a resin paste.

The protrusions 20a, 20b, and 20c preferably have a height (in the z direction as shown in FIGS. 1, 2) of about a half or less of the thickness of the lead frame 20. Specifically, the height to the bottom surface 14 (the height of the top surface of the protrusion of the lead frame 20) to the top surface of the protrusion is preferably 0.2 mm or less, more preferably 0.01 mm to 0.1 mm. The upper surface is preferably arranged so that the length (in the x direction in FIGS. 1, 2) and the width (in the y direction in FIGS. 1, 2) can provide a sufficient area for mounting the light emitting element 50 on the upper surface or for attaching the wires 40. In the case where the light emitting element 50 to be mounted, the area of the bottom surface of the light emitting element 50 is preferably 50% to 150% with respect to the area of the upper surface of the protrusion 20a. With this arrangement, preferable heat dissipation and preferable mounting of the light emitting element can be both achieved. The area of the protrusion 20b where the wire 40 to be connected can be approximately the same as or smaller than the area of the protrusion 20a where the light emitting element 50 to be mounted. Also, the protrusions 20a, 20b, and 20c can be arranged such that, the distance to the closest adjacent protrusion (a protrusion of the same lead frame) can be reduced, depending on the processing technique to be used, for example, to about 0.1 mm in the case of applying etching. Preferably, the distance is 0.1 mm or greater.

The light emitting element 50 can be electrically connected to the lead frame 20. One of preferable types of connection is as shown in the figures, connecting the upper surface of the protrusion 20b and the light emitting element 50 with a wire (that is, the upper surface of the protrusion 20b functions as a wire pattern). The light emitting element 50 may not be electrically connected to the lead frame 20. For example, in the case where the lead frame 20 has only one protrusion (for example, the protrusion 20a), and the light emitting element 50 is mounted on this single protrusion, the light emitting element 50 is not needed to be electrically connected to the lead frame 20.

The gap (recess) 25a between the protrusion 20a and the protrusion 20b of the lead frame 20 is filled with the resin of the resin portion 10, and the resin in the gap 25a forms a part of the bottom surface 14 of the recess 12 of the resin portion 10 at the upper end of the gap 25a.

Preferably, as shown in the figures, the gap 25b between the protrusion 20b and the protrusion 20c is filled with the resin of the resin portion 10, and the resin in the gap 25b also forms a part of the bottom surface 14 of the recess 12 of the resin portion 10 at the upper end of the gap 25b.

As described above, in the case where the lead frame 20 has at least two protrusions on its upper surface, the resin which constitutes the bottom surface 14 of the resin portion 10 is arranged in the gaps between the at least two protrusions. Further, at least one protrusions (protrusion 20a) of the upper surface of the lead frame 20 is exposed from the resin portion 10 at the bottom surface 14, and the light emitting element 50 is mounted on the upper surface of the exposed protrusion 20a.

As described above, the gap 25a and the gap 25b in the lead frame 20 are filled with the resin which forms the bottom surface 14 of the recess 12. Thus, at the bottom surface 14 of the recess 12, exposure of the metal frame 20 which has a low reflectance can be reduced and the ratio of the resin which has a high reflectance can be increased. This means that more of the light from the light emitting element that reached the bottom surface 14 of the recess 12 is reflected, and accordingly, more of the light is released to outside from the light emitting device 100. That is, the light emitting device 100 has a higher light emitting efficiency.

Heat generated by emission of the light emitting element 50 upon supplying electricity is transferred in the lead frame 20 via the upper surface of the protrusion 20a. The lead frame 20 is arranged not only directly under the light emitting element 50 but also extending in a lateral direction as shown in FIG. 2 (in x direction in the figure) and has a sufficient volume. Therefore, heat generated by the light emitting element 50 can be absorbed sufficiently to be released outside of the light emitting device 100. Particularly, at the location directly under the light emitting element 50, the bottom surface (lower surface) of the lead frame 20 is exposed from the resin portion 10, thus the heat can be released more efficiently. As shown in FIG. 2, the protrusion 20a having the light emitting element 50 mounted thereon preferably has a surface (backside surface) which faces the mounting surface for the light emitting element 50 is exposed from the resin portion 10 (that is, at the lower surface of the lead frame 20, the portion directly under the protrusion 20a is exposed from the resin portion 10). As shown in FIG. 2 and FIG. 4, the lead frame 20 is preferably exposed from the resin portion 10 at the side surfaces and/or the bottom surface of the package 30. This is because the heat generated by the light emitting element 50 can be released more easily to outside of the light emitting device. The detailed description of preferred embodiments will be given later.

Also, the resin gets into the gap 25a and the gap 25b and then adheres (bonds) to the side surfaces of the protrusions 20a, 20b, and 20c, and further adheres to the bottom surfaces (the upper surfaces of the lead frame in the gaps 25a, 25b) of the gaps 25a, 25b. Thus, the area where the resin of the resin portion 10 and the lead frame 22 adhere each other can be increased. Accordingly, risk of detachment between the resin portion 10 and the lead frame 20 can be reduced.

Lead Frame 22

The light emitting device 100 may include a lead frame (a second lead frame) 22 as shown in the figures. The lead frame 22 is arranged, in the same manner as in the lead frame (first lead frame) 20, in the resin portion 10 and at least a part of the lead frame 22 is located under the bottom surface 14. The lead frame 22 has two protrusions 22a, 22b on its upper surface and the protrusion 22a is located under the bottom surface 14 of the recess 12. Further, the upper surface (may be referred to as "top surface") of the protrusion 22a is not covered with the resin of the resin portion 10 and is exposed from the resin portion 10 at the bottom surface 14.

The protrusions 22a, 20b preferably have a height (in z direction as shown in FIGS. 1, 2) of about a half or less of the thickness of the lead frame 22. More specifically, the height to the bottom surface 14 is preferably 0.2 mm or smaller, more preferably 0.01 mm to 0.1 mm. The upper surface is preferably arranged so that the length (in x direction in FIGS. 1, 2) and the width (in y direction in FIGS. 1, 2) can provide a sufficient area for attaching the wires 42 etc. The area of the protrusion 22a where the wire 42 to be connected can be approximately the same as or smaller than the area of the protrusion 20a where the light emitting element 50 to be mounted. Also, the protrusions 22a, 20b can be arranged such that, the distance to the closest adjacent protrusion (a protrusion of the same lead frame) can be reduced, depending on the processing technique to be used, for example, to about 0.1 mm in the case of applying etching. Preferably, the distance is 0.1 mm or greater.

The light emitting element 50 is electrically connected to the upper surface of the protrusion 22a via a wire 42 (that is, the upper surface of the protrusion 22a functions as a wire pattern).

The gap (recess) 25c between the protrusion 22a and the protrusion 22b of the lead frame 22 is filled with the resin of the resin portion 10, and the resin which fills the gap 25c forms a part of the bottom surface 14 of the recess 12 of the resin portion 10 at the upper end of the gap 25c.

As described above, the gap 25c is filled with the resin which forms a part of the bottom surface 14 of the recess 12. Thus, at the bottom surface 14 of the recess 12, exposure of the metal frame 22 which has a low reflectance can be reduced and the ratio of the resin which has a high reflectance can be increased. This means that more of the light from the light emitting element 50 that reached the bottom surface 14 of the recess 12 is reflected, which allows more light to be released out from the light emitting device 100. That is, although the light emitting device 100 includes two lead frames 20, 22, high power efficiency can be achieved.

Also, the resin gets into the gap 25c and then adheres (bonds) to the side surfaces of the protrusions 22a, 22b, and further adheres to the bottom surface of the gap 25c (the upper surfaces of the lead frame 22 in the gap 25c). Thus, the area where the resin of the resin portion 10 and the lead frame 22 adhere each other can be increased. Accordingly, risk of detachment between the resin portion 10 and the lead frame 22 can be reduced.

More preferably, as shown in FIG. 2 and FIG. 4, the gap 25c is located under (directly under) the connecting portion (portion where the bottom surface 14 and the side surfaces 16 meet) between the bottom surface 14 of the recess 12 of the resin portion 10 and the side surfaces 16 of the recess 12. That is, the connecting portion between the side surfaces 16 of the recess 12 and the bottom surface 14 of the recess 12 is located above between the protrusion 22a and the protrusion 22b (above the gap 25c between the protrusion 22a and the protrusion 22b). The connecting portion between the bottom surface 14 and the side surfaces 16, where the stress tends to concentrate and detachment is easily initiated, can be secured to be free from the existence of the lead frame 22, and thus detachment between the resin portion 10 and the lead frame 22 can be securely prevented.

It is more preferable that the lead frame 20 also has a similar structure as described above. That is, as shown in FIG. 2 and FIG. 3, it is more preferable that the gap 25b is located under (directly under) the connecting portion (portion where the bottom surface 14 and the side surfaces 16 meet) between the bottom surface 14 of the recess 12 of the resin portion 10 and the side surfaces 16 of the recess 12. With this arrangement, similar effects can be obtained with the lead frame 20.

Figure 6:
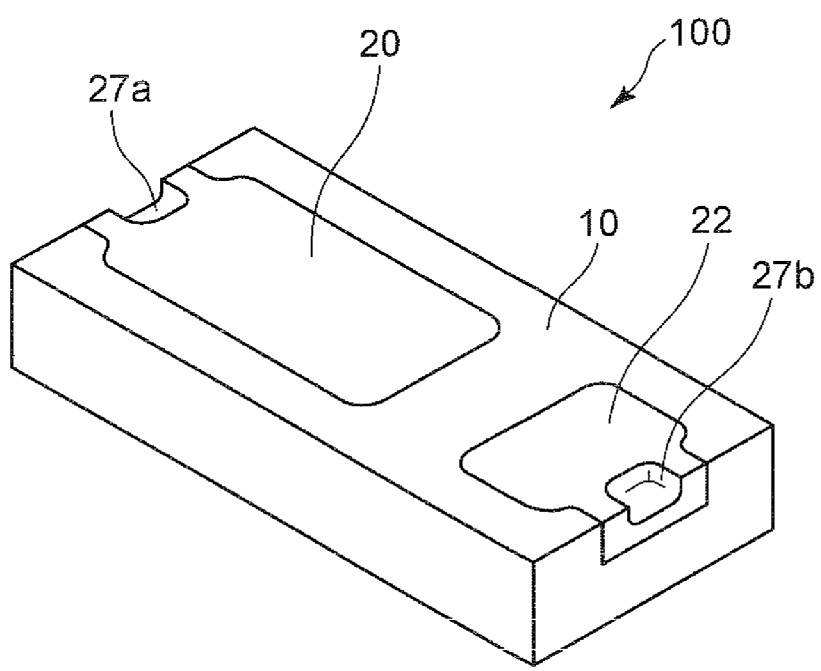
FIG. 6 is a perspective view showing a bottom surface and side surfaces of the light emitting device 100.

FIG. 6 is a perspective view showing a bottom surface and side surfaces of the light emitting device 100. It is preferable that as shown in FIG. 2, FIG. 4, and FIG. 5, the side surfaces (the side surface in the right in FIG. 2 and FIG. 4) and/or the bottom surface (shown as the lower surface in FIG. 2 and FIG. 4, and the upper surface in FIG. 5) is exposed from the resin portion 10. With this arrangement, heat generated by the light emitting element 50 can be more easily released to outside of the light emitting device 100. In this case, it is more preferable that at the bottom surface of the lead frame, for example as shown in FIG. 2 and FIG. 4, the portion directly under the protrusion 20a where the light emitting element 50 is mounted is exposed from the resin portion 10. Further, as described above, a part of the surface of the lead frame 20 is exposed to outside, so that the lead frame 20 can be easily electrically connected to an electric contact such as an electrode of a mounting substrate on which the light emitting device 100 to be mounted.

In a similar manner, it is preferable that as shown in FIG. 2, FIG. 4, and FIG. 5, the side surfaces (the side surface in the left in FIG. 2 and FIG. 4) and/or the bottom surface (shown as the lower surface in FIG. 2 and FIG. 4, and the upper surface in FIG. 5) of the lead frame 22 is exposed from the resin portion 10. As described above, a part of the surface of the lead frame 22 is exposed to outside, so that the lead frame 22 can be easily electrically connected to an electric contact such as an electrode of a mounting substrate on which the light emitting device 100 to be mounted.

In the light emitting device 100 according to the embodiments shown in FIG. 2, FIG. 4, and FIG. 5, for example, the bottom surface of the respective lead frames 20, 22 is fixed with the use of a solder or the like, on the electrode arranged on the mounting substrate. Thus the lead frame 20 and the lead frame 22 can be respectively electrically connected to the corresponding external electrodes.

In this case, preferably, the lead frame 20 has a cut-off portion (recess) 27a in the exposed portions of the bottom surface and a side surface. In a similar manner, preferably, the lead frame 22 has a cut-off portion 27b in the exposed portions of the bottom surface and a side surface. At the time of fixing the respective bottom surfaces of the lead frame 20 and the lead frame 22 on the electrodes of the mounting substrate by using a solder, the solder material gets in the cut-off portion 27a and the cut-off portion 27b. With this arrangement, the lead frame 20 and the lead frame 22 can be respectively fixed more stably on the corresponding electrodes. As a result, the lead frame 20 and the lead frame 22 can be respectively electrically connected more stably.

Positional relationship between bottom surface of recess of resin portion and upper surface of protrusion of lead frame. Next, the positional relationship between the bottom surface 14 of the recess 10 and the upper surface of the protrusion 20a will be described in detail below. In a preferable embodiment of the bottom surface 14, as shown in FIG. 2 and FIG. 4, the bottom surface 14 is a flat surface. That is, the respective upper surfaces of the protrusions 20a, 20b of the lead frame 20, the upper surface of the protrusion 22a of the lead frame 22, and other portions of the bottom surface 14 (that is, portions made of the resin) locate on the same plane (share the same plane). Such a configuration can be easily formed at the time of forming the package 30 in which the lead frames 20 and 22 are arranged in a mold and a resin is injected in the mold by way of transfer molding technique to form the package 30, by arranging the upper surfaces of the protrusions 20a, 20b, and 22a respectively being in contact with the corresponding portions of the mold for forming the recess 12.

The resin is supplied while the upper surfaces of the protrusions are kept in contact with the mold, so that the upper surfaces of the protrusions 20a, 20b, and 22a are not covered with the resin, or even if they are covered with the resin, the thickness of the resin will be very thin and therefore is easily removed by burr trimming, and thus, the upper surfaces of the protrusions 20a, 20b, and 22a can be exposed easily, and which is advantageous.

On the bottom surface 14 having such a configuration, the size of the light emitting element 50 to be mounted on the upper surface of the protrusion 20a, in more detail, the size of the bottom surface of the light emitting element 50 which is the portion to be mounted on the upper surface of the protrusion 20a, is preferably such that both the length (in x direction in FIG. 1 and FIG. 2) and the width (in y direction in FIG. 1 and FIG. 2) are within a range of plus and minus 0.1 mm with respect to the length and the width of the upper surface of the protrusion 20a. Within the range, there is less portion among the upper surface of the protrusion 20a which is not covered with the light emitting element 50 and therefore has a low reflectance (including the case in which silver plating has discolored due to corrosion), so that the bottom surface 14 can maintain a higher reflectance. Further, with the size of the bottom surface of the light emitting element 50 in this range, a so-called self-alignment effect can be obtained. That is, the bottom surface of the light emitting element 50 and the outer shape of the upper surface of the protrusion 20a have an approximately the same shape (or have conforming shapes). Therefore, for example, when the light emitting element 50 is to be fixed on the upper surface of the protrusion 20a by using eutectic bonding technique, the bottom surface of the light emitting element moves to be located at the center of the upper surface of the protrusion 20a, so that the light emitting element 50 can be mounted with extremely high mounting accuracy. The shape of the upper surface of the protrusion 20a is preferably in conformity to the planar view shape of the light emitting element 50. For example, in the case where the light emitting element 50 has an approximately square shape in plan view, the shape of the upper surface of the protrusion 20a is also formed in an approximately square shape. The shape of the upper surface of the protrusion 20a may be, as shown in FIG. 3, a shape with rounded corners (that is, a polygonal shape which has at least a part of or all (at least a part) the corners are rounded). With such a shape, the wettability with an adhesion material for adhering the light emitting element 50 can be improved. Particularly it is preferable in the case where the light emitting element 50 is adhered by using an adhesion material which contains a metal such as in a eutectic bonding.

Such a preferable relationship between the size of the bottom surface of the light emitting element and the size of the upper surface of the protrusion 20 can be determined by the area instead of by the length and the width. More specifically, the area of the bottom surface of the light emitting element 50 is preferably in a range of 50% to 150% with respect to the area of the upper surface of the protrusion 20. The reason why the above area range is preferable is the same as that in the range of the size of the length and the width described above. That is, at least a half (50% or greater) the area of the upper surface of the protrusion 20 is covered with the light emitting element 50 (the bottom surface of the light emitting element 50). With this arrangement, the portion of the upper surface of the protrusion 20a which is not covered with the light emitting element 50 and therefore has a low reflectance (including the case in which silver plating has discolored due to corrosion) can be reduced, so that a higher reflectance can be maintained at the bottom surface 14.

Figure 7:
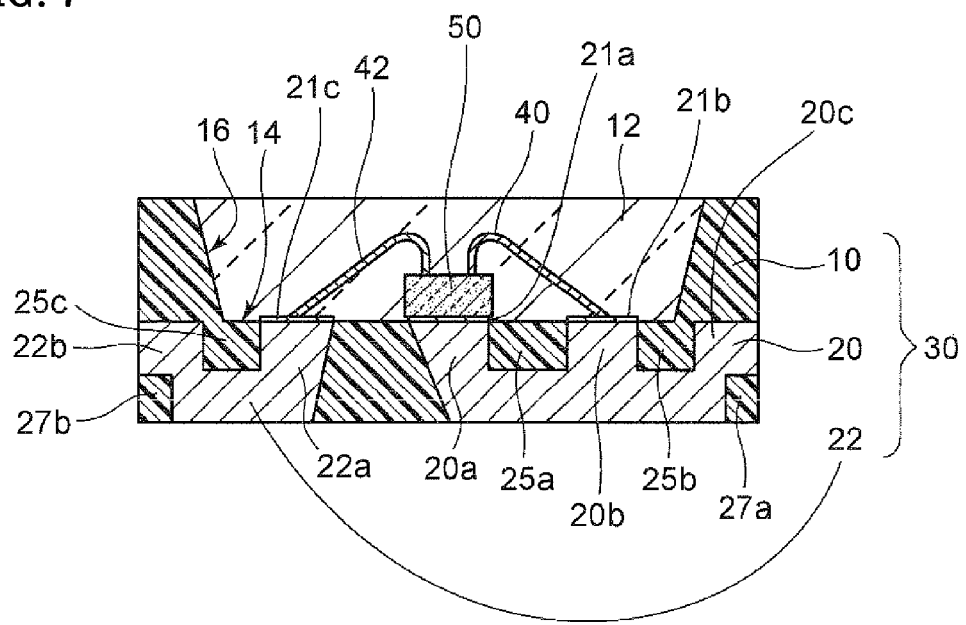
FIG. 7 is a cross-sectional view showing a positional relationship between the bottom surface 14 of the recess 12 of the resin portion 10 and the upper surfaces of the protrusions, according to another embodiment.

Another embodiment of positional relationship between bottom surface of recess of resin portion and upper surface of protrusion of lead frame. FIG. 7 is a cross-sectional view showing the positional relationship between the bottom surface 14 of the recess 12 of the resin portion 10 and the upper surfaces of the protrusions, according to another embodiment. In the embodiment shown in FIG. 7, the protrusion 20a of the lead frame 20 is at the bottom surface 14, protruded from the surface of the resin portion 10 (among the bottom surface 14, portions other than the upper surface of the protrusion 20a, the upper surface of the protrusion 20b, and the upper surface of the protrusion 22a). In this case, preferably, as shown in FIG. 7, the protrusion 20b of the lead frame 20 and the protrusion 22a of the lead frame 22 are also protruded in a same manner. Such protrusion of the protrusion of the lead frame can be obtained by, for example, at the time of arranging the lead frame 20 and the lead frame 22 in the mold respectively, and using a transfer-molding technique, supplying a resin into the mold to form the package 30, adjusting the shape of the mold so that the surface to be the bottom surface 14 of the resin portion 14 is arranged lower than the upper surfaces of the protrusions 20a, 20b, and 22a, respectively.

But, preferably, as described above, the upper surfaces of the protrusions can be more easily formed to protrude from the surface of the resin portion 10, by arranging the corresponding portions of the upper surfaces of the protrusions 20a, 20b of the lead frame 20, the upper surface of the protrusion 22a of the lead frame 22, and the portions of the bottom surface 14 other than those portions (that is, the portions made of a resin) on a same plane, then, plating is applied so that the top surfaces of the protrusions 20a, 20b, and 22a are respectively covered with a plated layer (metal layer) 21a, 21b, or 21c.

The plated layers 21a, 21b, 21c are made by, for example, metal plating using a metal selected from silver, gold, nickel, palladium, steel, tin, etc., or alloy plating using a combination of such metals. Preferably, silver, which has a high reflectance and/or gold, which has good adhesion with the wires is selected. The plated layers 21a, 21b, 21c can be selectively formed only on the protrusions 20a, 20b, and 22a, by after forming the resin portion 10, applying electrolytic plating.

The plated layers 21*a*, 21*b*, 21*c* can be formed in the same manufacturing step by employing the same material.

As described above, at the bottom surface 14, arranging the upper surfaces of the protrusions of the lead frames protruded from the surface of the resin portion 10, for example, as shown in FIG. 7, allows the bottom surface of the light emitting element 50 to be bonded with the upper surface (light emitting element bonding portion) of the protrusion 20*a* without getting in touch with the resin portion 10, even in the case where the bottom surface of the light emitting element 50 is larger than the upper surface of the protrusion 20*a* (the light emitting element 50 is mounted over (to the outer side in the longitudinal direction (in x-direction) and/or in the lateral direction (in y-direction) of the upper surface of the protrusion 20*a*). With this arrangement, the light emitting element 50 can be mounted on the upper surface of the protrusion 20*a* with high accuracy and high stability. Particularly, in the case where the light emitting element 50 is mounted by using eutectic bonding, the bottom surface of the light emitting element 50 which is larger than the upper surface of the protrusion 20*a* tends to result in insufficient bonding, but arranging the upper surface of the protrusion 20*a* protruding from the surface of the resin portion 10 as described above allows employing of eutectic bonding with high accuracy and stability. With the use of eutectic bonding, the light emitting element and the lead frame can be connected with a metal material having a good thermal conductivity, so that heat of the light emitting element can be efficiently released to the lead frame 20.

(2) Variant Example 1

Figure 8A:
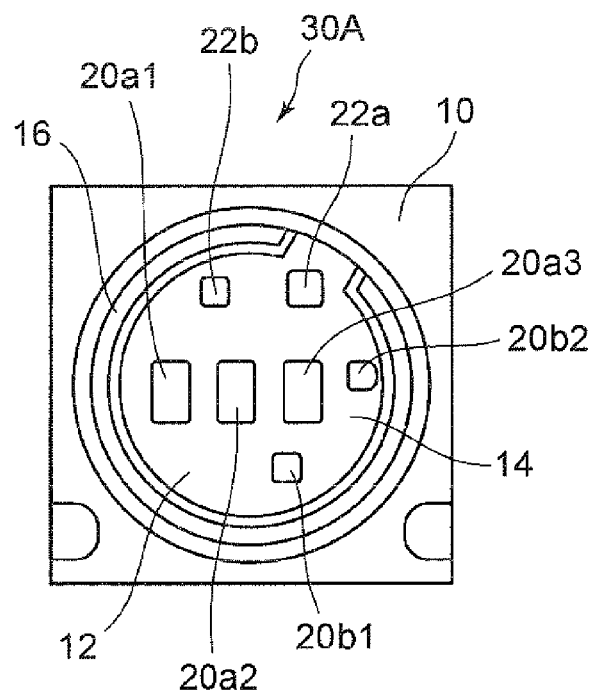
FIG. 8A is a plan view showing the package 30A according to Variant Example 1 of the present embodiment.
Figure 8B:
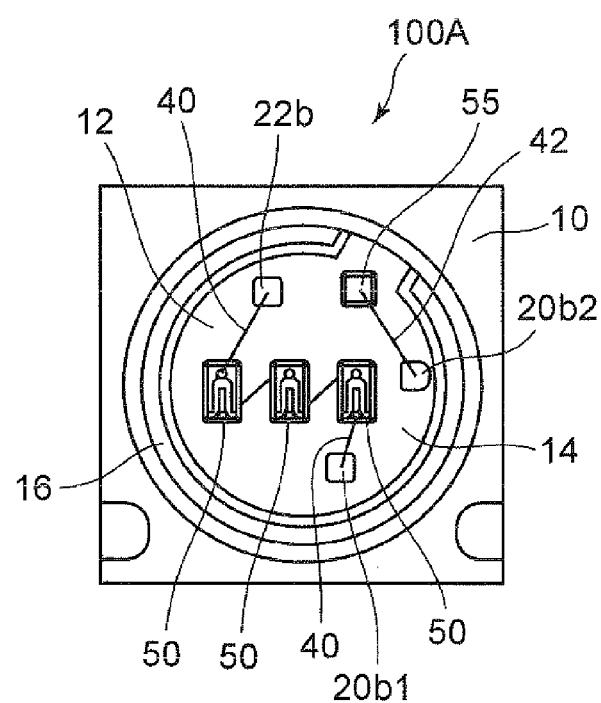
FIG. 8B is a plan view showing the light emitting device 100A according to Variant Example 1 of the present embodiment.

FIG. 8A is a plan view showing the package 30A according to Variant Example 1 of the present embodiment, and FIG. 8B is a plan view showing the light emitting device 100A according to Variant Example 1 of the present embodiment. In the light emitting device 100A, a plurality of light emitting elements 50 (three units in an embodiment shown in FIG. 8B) are mounted on the protrusions 20*a*1, 20*a*2, 20*a*3, which are respectively formed on the different lead frames. The protrusions 20*a*1, 20*a*2, 20*a*3 may have the same structure as the protrusion 20*a* described above. In the similar manner as in the light emitting device 100, the protrusions 22*b*, 20*b*1, 20*b*2 and the protrusion 22*a* of the lead frames are arranged, on which a light emitting element 50 is not arranged. Unless otherwise specified, the protrusions 20*b*1, 20*b*2, 22*b* may have the same structure as the protrusion 20*b* described above. The wire 40 and/or the wire 42 may be connected to the upper surfaces of the protrusions 20*b*1, 20*b*2 and the protrusions 22*a*, 22*b*. Also, it is similar to that in the light emitting device 100 in which, a plurality of the lead frames each having the protrusions as described above are arranged in the resin portion of the package 30A and also under the bottom surface 14 of the resin portion, and the resin forming the bottom surface 14 is also in the gaps between the protrusions.

Also, at least one upper surface of the protrusions 20*b*1, 20*b*2 and the protrusions 22*a*, 22*b* where the light emitting element 50 is not arranged, as shown in FIG. 8(*b*), an element other than the light emitting element, for example, a Zener diode 55 which serves as a protective element, may be arranged.

(3) Variant Example 2

Figure 9:
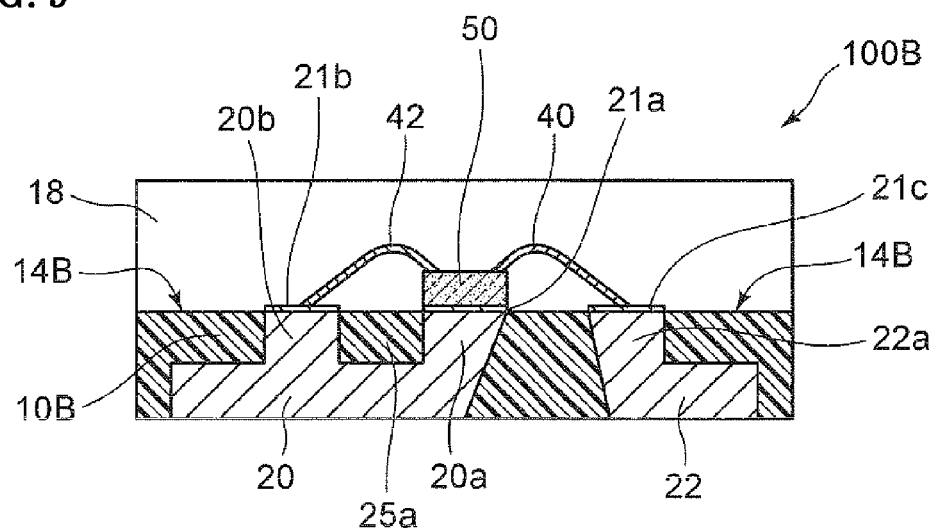
FIG. 9 is a cross-sectional view showing a light emitting device 100B according to Variant Example 2.

FIG. 9 is a cross-sectional view showing a light emitting device 100B according to Variant Example 2. The resin portion 10B of the light emitting device 100B does not have a recess which is different from the resin portion 10 of the light emitting device 100. Thus, the term "package" in the present variant example refers to a package made of a resin portion 10B and lead frames 20,22, and the term "package" in the present specification refers also to a package in which a resin portion does not includes a recess. Such a light emitting device in which the resin portion does not include a recess, and therefore the light emitting element 50 is arranged on the upper surface 14B of the resin portion 10B, is also include in the present embodiment. In the light emitting device 100, the bottom surface 14 and the side surfaces 16 of the recess 12 function as a reflector to reflect light of the light emitting element 50, but on the other hand, the light emitting device 100B lacks the recess 12 and thus portions corresponding to the side surfaces 16 do not exist. The portion corresponding to the bottom surface 14 of the light emitting device 100 is the upper surface 14B of the resin portion 10B of the light emitting device 100B. In other words, the upper surface 14B serves as an element mounting surface in the present variant example. That is, the light from the light emitting element 50 and reaches the upper surface 14B of the resin portion 10B is reflected at the upper surface 14B in a desired direction.

The lead frame 20 shown in FIG. 9 has at least one protrusion (for example, the protrusion 20*a*), preferably has at least two protrusions 20*a* and 20*b*, and the upper surfaces of the protrusions 20*a*, 20*b* are exposed from the resin portion 10B at the upper surface 14B of the resin portion 10B. The gap (recess) 25*a* between the protrusion 20*a* and the protrusion 20*b* of the lead frame 20 is filled with the resin of the resin portion 10B, and the resin in the gap 25*a* forms a part of the upper surface 12 of the recess 12 of the resin portion 10B at the upper end of the gap 25*a*.

As described above, in the case where the lead frame 20 preferably have at least two protrusions on its upper surface, the resin which constitutes the upper surface 14 of the resin portion 10B is arranged in the gaps between the at least two protrusions. Further, at least one protrusion (protrusion 20*a*) of the upper surface of the lead frame 20 is exposed from the resin portion 10B at the upper surface 14B, which is one of the surfaces of the resin portion 10B, and the light emitting element 50 is mounted on the upper surface of the exposed upper surface of the protrusion 20*a*. This allows a higher light emitting efficiency as in the light emitting device 100.

Heat generated by emission of the light emitting element 50 upon supplying electricity is transferred in the lead frame 20 via the upper surface of the protrusion 20*a* and conducted in the lead frame 20. The lead frame 20 is arranged not only at directly under the light emitting element 50 but also extending in a lateral direction as shown in FIG. 9 and has a sufficient volume. Therefore, heat generated by the light emitting element 50 can be absorbed sufficiently to be released outside of the light emitting device 100B. As shown in FIG. 9, at the bottom surface of the resin portion 10B, the lead frame 20 is exposed. With this arrangement, the heat from the light emitting element 50 can be released more efficiently to outside of the light emitting device 100B. Particularly, at the location directly under the light emitting element 50, the bottom surface of the lead frame 20 is exposed from the resin portion 10B, thus the heat can be released more efficiently.

Also, the resin gets into the gap 25*a* and adheres to the lead frame 20, thus the area where the resin of the resin portion 10B and the lead frame 20 adhere can be increased. Accordingly, risk of detachment between the resin portion 10B and the lead frame 20 can be reduced. Particularly, as shown in FIG. 9, in the resin portion 10B where the recess is not formed, the contact area between the resin portion 10B and the lead frame 20 tends to be small, so that with a structure as described above, a light emitting device 100B in which occurrence of detachment can be prevented and thus has high reliability can be obtained.

Also, in the embodiment shown in FIG. 9, the protrusions 20a, 20b, and 22a have the plated layers 21a, 21b, and 21c on the upper surfaces respectively. Thus, a similar structure as in the light emitting device according to the embodiment shown in FIG. 7 and similar effects can be obtained.

Of course, the lead frames 20, 22 are not limited to the embodiment illustrated in FIG. 9, and the embodiments described above for the light emitting device 100 can also be applied in a same manner.

Next, components of the light emitting devices 100, 100A, and 100B will be described in detail.

(Light Emitting Element)

For the light emitting element 50, a face-down structure having a p-electrode and an n-electrode disposed on the same plane side may be employed as well as a face-up structure. In the case of face-up structure, as shown in FIG. 1 and FIG. 2, it may be such that more than one protrusions 20a, 20b are formed on one lead frame 20, a light emitting element 50 is mounted on one of the protrusion 20a and a wire 40, which is electrically connected to the p-electrode (or the n-electrode) of the light emitting element 50, is connected to the other protrusion 20b, and further, a wire 42, which is electrically connected to the n-electrode (or the p-electrode) of the light emitting element 50, is connected to the protrusion 22a formed on the other lead frame 22. For the light emitting element 50, a light emitting element can also be employed, in which, a both-side electrode structure where the p-electrode and the n-electrode are respectively formed on two main surfaces which are facing each other. In this case, it can be such that the electrode at the back side of the light emitting element 50 is electrically connected to the lead frame 20 via an electrically conductive adhesive, and the electrode at the front side of the light emitting element 50 is electrically connected to the other lead frame 22 via a wire. In this case, plural light emitting elements 50 are preferably respectively mounted on each of the plural protrusions 20a, 20b arranged on the lead frame 20. The size of the light emitting elements 50 is not specifically limited and a square shape or a rectangular shape with a side of 350 μm, 500 μm, or 1 mm can also be used. Also, a plural number of the light emitting elements may be employed. In the case where a plurality of the light emitting elements 50 are used, all of them may be of the same kind, or may be of different kinds respectively exhibiting emission color of red, green, and blue, which are the components of three primary colors of light.

(Package)

The packages 30, 30A each includes a resin portion made of a resin and a lead frame which are integrally molded.

The outer shape of the packages 30, 30A is not limited to be an approximately rectangular prism, but may be an approximately cube, an approximately hexagonal pillar, or a many-sided shape. Also, in an external top view, a shape such as an approximately triangular shape, an approximately rectangular shape, an approximately pentagonal shape, or an approximately hexagonal shape can be employed.

(Resin Portion)

A recess 12 defined by a bottom surface 14 and side surfaces 16 is formed in the resin portion 10. The recess portion 12 can be defined in various shapes, such as, when viewed from outer top surface side, an approximately circular shape, an approximately oval shape, an approximately rectangular shape, an approximately polygonal shape, or a combination of those can be employed. The recess portion 12 is preferably defined by a reverse-tapered shape toward opening, but a different shape such as a cylindrical shape can also be employed. The surface of the recess 12 may be formed smooth, but minute irregularity can be provided on the surface for scattering light. For the material of the resin portions 10, 10B, a triazine derivative epoxy resin which is a thermosetting resin can be preferably employed. The thermosetting resin may contain an acid anhydride, an antioxidant, a mold release agent, a light reflective member, an inorganic filler material, a curing catalyst, a light stabilizer, or a lubricant. Titanium dioxide is used for the light reflective member and is contained in the resin portion in an amount of 10 to 60 wt %. The resin portions 10, 10B are not limited to the embodiments described above, but preferably formed by using, among the thermosetting resins, at least one selected from the group consisting of an epoxy resin, a modified epoxy resin, a silicone resin, a modified silicone resin, an acrylate resin and an urethane resin. Particularly, an epoxy resin, a modified epoxy resin, a silicone resin, or a modified silicone resin is preferable. For example, to 100 parts by weight of a colorless and transparent mixture prepared by mixing and dissolving the equivalent quantities of an epoxy resin compound of such as triglycidyl isocyanurate and hydrogenated bisphenol A diglycidyl ether and an acid anhydride composed of such as hexahydrophthalic anhydride, 3-methyl-hexahydrophthalic anhydride and 4-methyl-hexahydrophthalic anhydride, 0.5 parts by weight of DBU (1,8-diazabicyclo(5,4,0)undecene-7) as a curing accelerator, 1 part by weight of ethylene glycol as a co-catalyst, 10 parts by weight of titanium oxide pigment, and 50 parts by weight of a glass fiber are added and heat is applied to partially cure it to obtain a B-stage solid epoxy resin composition, and which is used for the resin package. Also, the resin portions 10, 10B are each formed with an insulating material which has heat resistance and appropriate mechanical strength and which is hardly permeate light emitted from the light emitting element 50 and outside light. For such a material, among the thermosetting resins, at least one selected from the group consisting of an epoxy resin, a modified epoxy resin, a silicone resin, a modified silicone resin, an acrylate resin and an urethane resin can be used. Particularly, an epoxy resin, a modified epoxy resin, a silicone resin, and a modified silicone resin are suitable materials for the resin portion 10. Also, a thermoplastic resin such as a liquid crystal polymer, a polyphthalamide resin, or a polybuthylene terephthalate (PBT) may be employed. In the resin, a light reflecting member etc. may be contained. For the light reflective member, titanium dioxide can be used with a content of 0.1 to 90 wt %, preferably 10 to 60 wt %. The resin portions 10, 10B has a light reflectance of 70% or greater at 350 nm to 800 nm, but preferably has a light reflectance of 80% or greater at 420 nm to 520 nm. It is also preferable to have high reflectance in the light emitting region of the light emitting element 50 and the light emitting region of a fluorescent material (if used).

(Lead Frame)

The lead frames 20, 22 are made by using a good electric conductor such as iron, phosphor bronze, and a copper alloy. Moreover, where appropriate, in order to improve reflectance for example, a metal plating such as silver, aluminum, copper, or gold can be applied.

(Wire)

The wires 40, 42 may be made of various materials such as a metal, having electrical conductivity. Preferably the wires are made of gold, copper, aluminum, or gold alloy, silver alloy or the like.

(Sealing Material)

The recess 12 of the resin portion 10 of the light emitting devices 100, 100A is preferably filled with a sealing material. Also, in the light emitting device 100B, a sealing member 18 (see FIG. 9) made of a sealing material may be arranged surrounding the light emitting element 50 on the upper surface 14B of the resin portion 10B where the light emitting element 50 is arranged. A thermosetting resin can be employed for the sealing member. Among the thermosetting resin, it is preferable to use at least one kind selected from the group consisting of an epoxy resin, a modified epoxy resin, a silicone resin, a modified silicone resin, an acrylate resin, and a urethane resin. Particularly, an epoxy resin, a modified epoxy resin, a silicone resin, a modified silicone resin are preferable. A hard type material is preferable for the sealing member to protect the light emitting element. Also, a resin excellent in thermo-resistance, weather-resistance, and light resistance is preferably used for the sealing member. In order to render a specific function to the sealing member, at least one selected from the group consisting of a filler material, a diffusing agent, a pigment, a fluorescent material, and a reflective material may be mixed in the sealing member. The diffusing agent may be contained in the sealing member. Examples of the diffusing agent include barium titanate, titanium oxide, aluminum oxide, and silicon oxide, which can be used preferably. In order to eliminate undesired wavelengths, an organic or inorganic coloring dye or coloring pigment can be contained in the sealing member. Moreover, a fluorescent material to absorb the light from the light emitting element and to convert the wavelength of the light can also be contained in the sealing member.

(Fluorescent Material)

The fluorescent material which absorbs light from the light emitting element and converts it into light of a different wavelength can be used. For example, it is preferable to employ at least one material selected from the group consisting of a nitride-based fluorescent material, an oxynitride-based fluorescent material, and a sialon-based fluorescent material which are activated mainly with a lanthanoid element such as Eu or Ce; an alkaline-earth halogen apatite fluorescent material, an alkaline-earth metal borate halogen fluorescent material, an alkaline-earth metal aluminate fluorescent material, an alkaline-earth silicate fluorescent material, an alkaline-earth sulfide fluorescent material, an alkaline-earth thiogallate fluorescent material, an alkaline-earth silicon nitride fluorescent material, and a germanate which are activated mainly with a lanthanoid element such as Eu and/or a transition-metal element such as Mn; a rare-earth aluminate and a rare-earth silicate which are activated mainly with a lanthanoid element such as Ce; and an organic compound and an organic complex which are activated mainly with a lanthanoid element such as Eu. Specific examples include the fluorescent materials shown below, but are not limited to these examples.

Examples of nitride-based fluorescent materials activated mainly with lanthanoid elements such as Eu or Ce include $M_2Si_5N_8$:Eu and MAlSiN$_3$:Eu (in which M is at least one selected from Sr, Ca, Ba, Mg, and Zn). In addition to $M_2Si_5N_8$:Eu, the examples also include MSi$_7$N$_{10}$:Eu, $M_{1.8}Si_5O_{0.2}N_8$:Eu, $M_{0.9}Si_7O_{0.1}N_{10}$:Eu (in which M is at least one selected from Sr, Ca, Ba, Mg, and Zn).

Examples of oxynitride-based fluorescent materials activated mainly with lanthanoid elements such as Eu or Ce include MSi$_2$O$_2$N$_2$:Eu (in which M is at least one selected from Sr, Ca, Ba, Mg, and Zn).

Examples of sialon-based fluorescent materials activated mainly with a lanthanoid element such as Eu or Ce include $M_{p/2}Si_{12-p-q}Al_{p+q}O_qN_{16-p}$:Ce and M-Al—Si—O—N (in which, M is at least one selected from Sr, Ca, Ba, Mg, and Zn, q is 0 to 2.5, and p is 1.5 to 3).

Examples of alkaline-earth halogen apatite fluorescent material, activated mainly with a lanthanoid element such as Eu and/or a transition-metal element such as Mn include $M_5(PO_4)_3X$:R (in which M is at least one selected from Sr, Ca, Ba, Mg, and Zn. X is at least one selected from F, Cl, Br, and I. R is at least one of Eu, Mn, or Eu and Mn).

Examples of alkaline-earth metal borate halogen fluorescent materials include $M_2B_5O_9X$:R (in which, M is at least one selected from Sr, Ca, Ba, Mg, and Zn. X is at least one selected from F, Cl, Br, and I. R is at least one of Eu, Mn, or Eu and Mn).

Examples of alkaline-earth metal aluminate fluorescent materials include SrAl$_2$O$_4$:R, Sr$_4$Al$_{14}$O$_{25}$:R, CaAl$_2$O$_4$:R, BaMg$_2$Al$_{16}$O$_{27}$:R, BaMg$_2$Al$_{16}$O$_{12}$:R, BaMgAl$_{10}$O$_{17}$:R (in which R is at least one of Eu, Mn, or Eu and Mn).

Examples of alkaline-earth sulfide fluorescent materials include La$_2$O$_2$S:Eu, Y$_2$O$_2$S:Eu, and Gd$_2$O$_2$S:Eu.

Examples of rare-earth aluminate fluorescent materials activated mainly with lanthanoid elements such as Ce include YAG-based fluorescent materials represented by compositional formulas such as Y$_3$Al$_5$O$_{12}$:Ce, (Y$_{0.8}$Gd$_{0.2}$)$_3$Al$_5$O$_{12}$:Ce, Y$_3$(Al$_{0.8}$Ga$_{0.2}$)$_5$O$_{12}$:Ce, and (Y,Gd)$_3$(Al,Ga)$_5$O$_{12}$:Ce. Examples thereof also include Tb$_3$Al$_5$O$_{12}$:Ce and Lu$_3$Al$_5$O$_{12}$:Ce, formed by substituting a part or all of Y with Tb or Lu.

Examples of the fluorescent materials include ZnS:Eu, Zn$_2$GeO$_4$:Mn, and MGa$_2$S$_4$:Eu (in which M is at least one selected from Sr, Ca, Ba, Mg, and Zn).

With the use of the fluorescent materials described above singly or a combination of two or more kinds, color hues which are in addition to blue, green, yellow, red, or the like, an intermediate colors of those, such as a blue green color, a yellow green color, or a orange color, can be realized.

(4) Method of Manufacturing

Figure 10A:
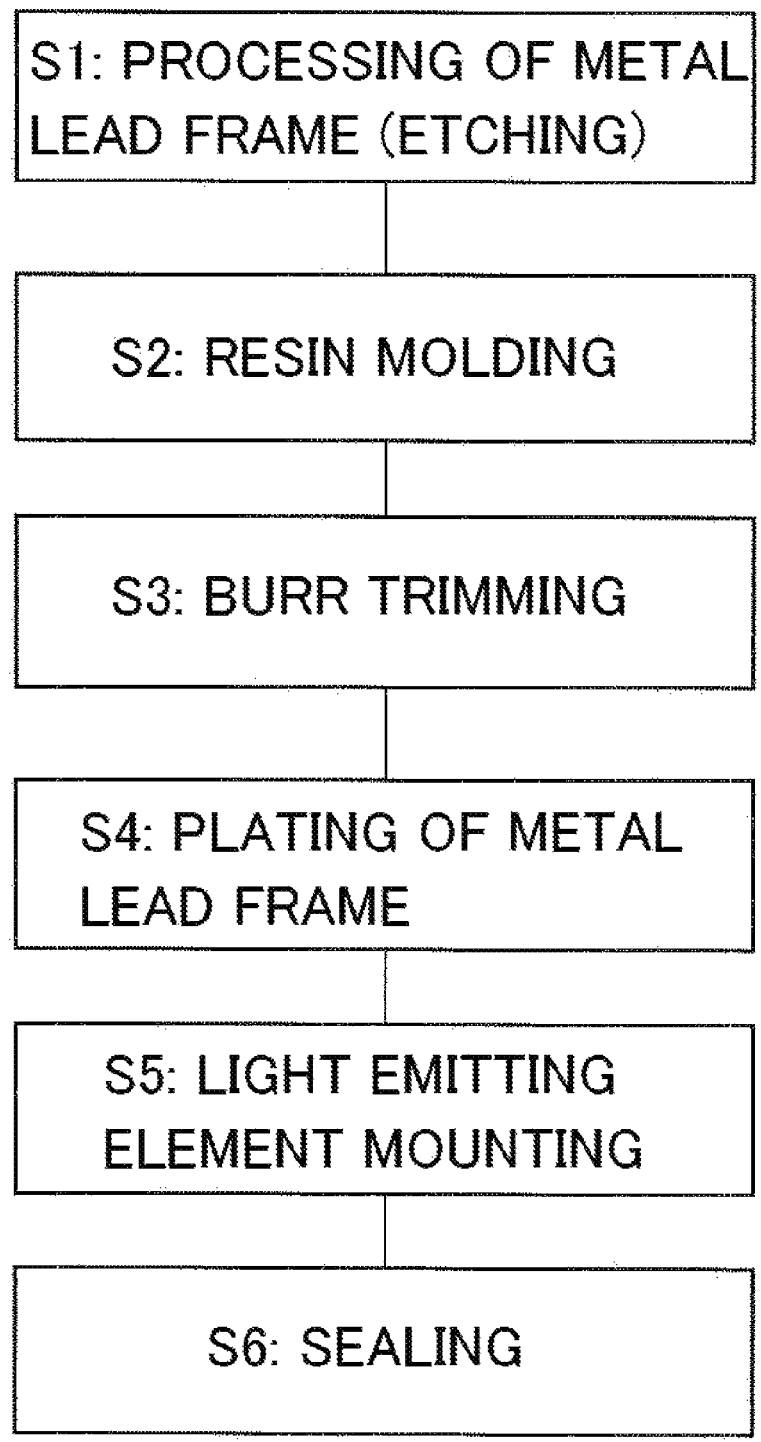
FIG. 10A is a schematic step chart depicting a first method of manufacturing a light emitting device 100 according to the present embodiment.
Figure 10B:
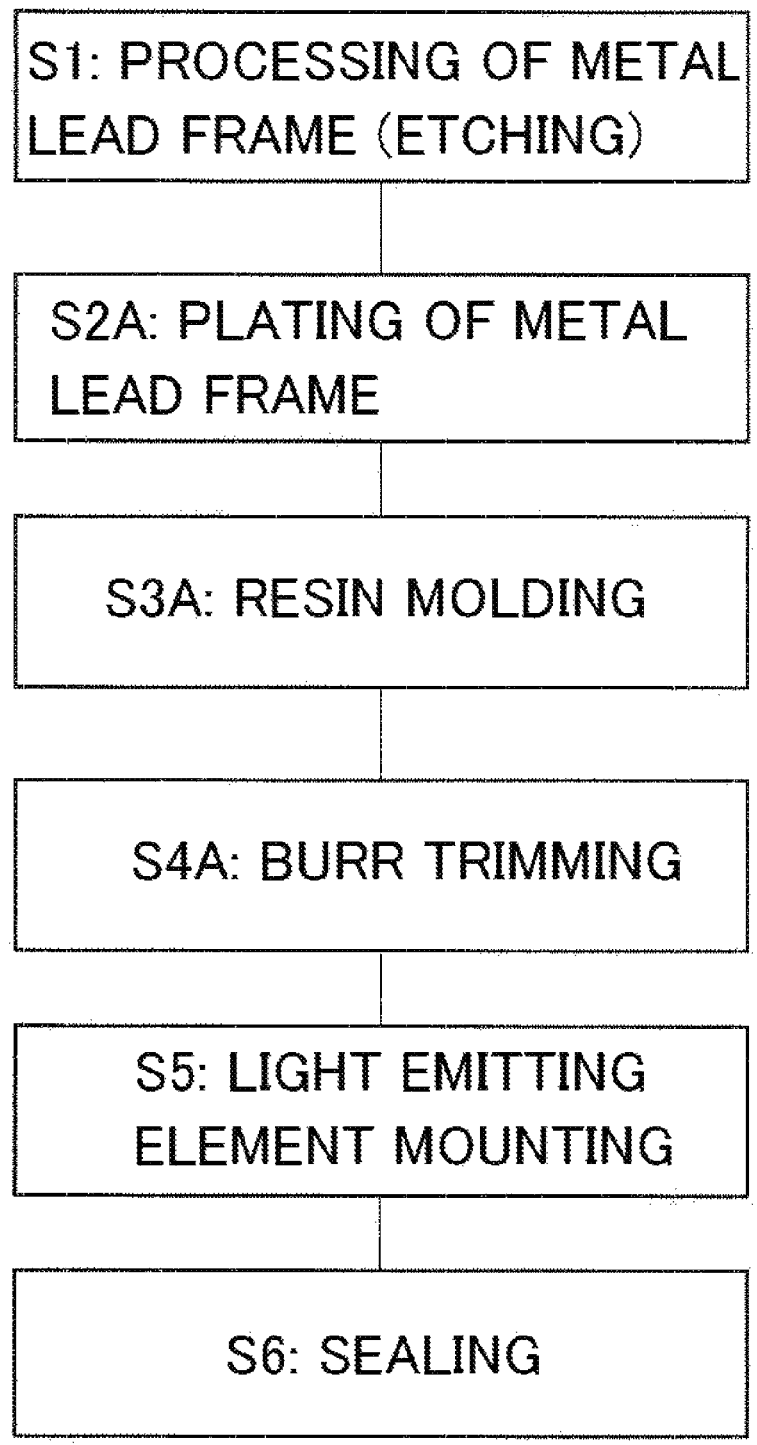
FIG. 10B is a schematic step chart depicting a second method of manufacturing a light emitting device 100 according to the present embodiment.

A method of manufacturing a light emitting device 100 will be described below. FIG. 10A is a schematic step chart depicting a first method of manufacturing a light emitting device 100 according to the present embodiment, and FIG. 10B is a schematic step chart depicting a second method of manufacturing a light emitting device 100 according to the present embodiment. Firstly, a first manufacturing method will be described with reference to FIG. 10A.

S1: Processing of Lead Frame

The lead frames 20, 22 can be formed by punching or by etching a flat metal plate. Particularly, etching processing is preferably employed, since it allows easy formation of the protrusions 20a, 20b, 20c, 22a, 22b from a planar metal plate. Also, cut-out portions 27a, 27b can be formed easily by an etching processing.

Figure 11:
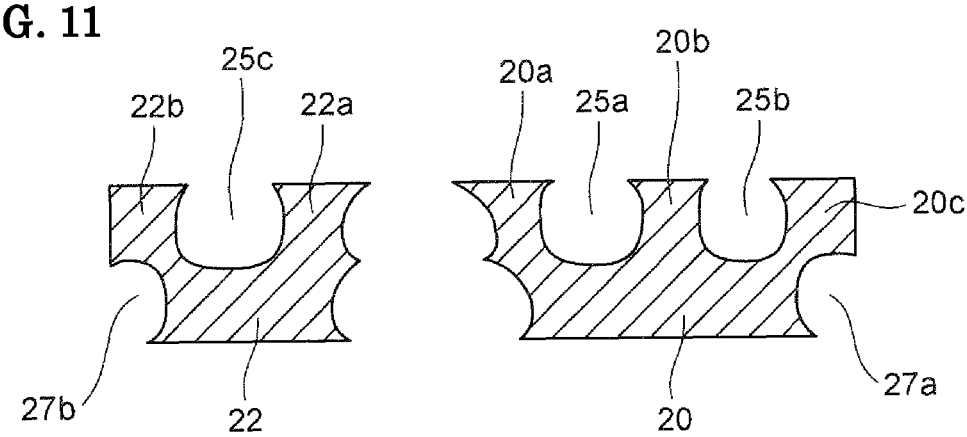
FIG. 11 is a cross-sectional view showing a more detailed shape of the lead frame 20 and the lead frame 22 formed by etching.

FIG. 11 is a cross-sectional view showing a more detailed shape of the lead frame 20 and the lead frame 22 formed by etching. The gaps 25, 25b, 25c of the lead frames 20, 22 formed by way of etching processing have a so-called barrel-shape which is in a longitudinal cross-sectional view (z-x cross section in FIG. 11), once widening from the upper surface toward the bottom surface and then narrowing further toward the bottom surface. Thus, adhesion between the resin of the resin portion 10 and the lead frames 20, 22 can be improved.

The etching processing may be performed to penetrate the lead frame 22 (cutout the external shape of the lead frame, for example, between the lead frame 20 and the lead frame 22 shown in FIG. 11) or may be performed from only one side of the metal plate so as not to penetrate (that is, forming of the protrusions 20a, 20b, 20c, 22a and 22b). In the case where etching is used to obtain a cutout, the adhesion with the resin can be improved by carrying out etching from the both sides of the metal plate to form two barrel shape portions which are arrayed in perpendicular direction (in z-axis direction), for example shown in FIG. 11, between the lead frame 20 and the lead frame 22.

For the etching technique, dry etching or wet etching can be employed. A suitable etchant for the material of the lead frames 20, 22 can be selected. The conditions of etching change according to factors such as the kinds of the metal to employ. For example, in the case where copper is employed for the lead frame, it is suitable to use a commonly-used copper soft etching solution, made of such as a persulfate salt or hydrogen peroxide and an inorganic acid, ferric chloride or copper chloride and a copper-ammonia complex salt inorganic solution and an ammonium salt.

S2: Resin Molding

Next, the lead frames 20 and 22 obtained in the above-described step of S1 are placed in a mold and by way of transfer-molding technique, a resin is applied to form a package 30. For the mold, for example, a separable mold made of an upper part and a lower part is preferably used to improve workability. Arranging the upper surfaces of the protrusions 20a, 20b, and 22a in contact with the portions of the mold which is used for forming the recess 12 of the resin portion 10 can form the upper surfaces of the protrusions 20a, 20b, 22a and the bottom surface 14 on the same plane and can expose the upper surfaces of the protrusions 20a, 20b, 22a are protruded from the resin portion.

S3: Burr Trimming

Where appropriate, for example, burrs, such as a resin which covers the upper surfaces of the protrusions 20a, 20b, 22a, occurred on the package 30 are removed by using a blast treatment, an electrolytic solution treatment (an alkali etc.) or a combination of those.

S4: Plating of Lead Frame

Where appropriate, for example, to improve the reflectance, plating is applied on the lead frame 20 and/or the lead frame 22. Particularly, as in an embodiment shown in FIG. 7, plating is a suitable treatment to obtain the protrusions 20a, 20b, 22b to be protruded from the surface of the resin portion 10 at the bottom surface 14 of the recess 12. Particularly, in the present method of manufacturing, a resin molding is performed in S2 step, so that the upper surfaces of the protrusions 20a, 20b, and 22b and the bottom surface 14 of the resin portions 10 are arranged in the same plane, then, the plating is performed. Thus, the protrusions 20a, 20b, and 22b can be more securely arranged to be protruded from the surface of the resin portion 10 at the bottom surface 14. For the plating treatment, either electrolytic plating or non-electrolytic plating can be employed. By way of electrolytic plating, a metal layer can be selectively formed only on the protrusions 20a, 20b, and 22a which are exposed from the resin portion 10.

S5: Mounting of Light Emitting Element

Next, a light emitting element 50 is mounted on an upper surface of the protrusion 20a. Eutectic bonding using an Au—Sn alloy is preferably employed. The light emitting element 50 can be fixed by using a resin paste, a silicon paste or a silver paste. After fixing the light emitting element 50, using wires 40, 42 and wire bonding technique, the light emitting element 50 is electrically connected with the lead frame 20 and the lead frame 22 respectively.

S6: Sealing

Where appropriate, the above-described sealing material is inserted in the recess 12 and hardened to seal the recess. Thus, the light emitting device 100 can be obtained.

Next, a second manufacturing method will be described with reference to FIG. 10B. In the first method of manufacturing, the processing is performed in order of S2: Resin Molding; S3: Burr Trimming; and S4: Plating of Lead Frame. But in the second method manufacturing, the processing is performed in order of S2A: Lead Frame; S3A: Resin Molding; and S4: Burr Trimming. Although the sequence of processing differs, each step is performed in substantially the same manner.

Changing the sequence of processing as described above, after applying plating on the lead frame 20 and/or lead frame 22, resin molding is performed. Thus, the plated upper surfaces of the protrusions 20a, 20b, and 22a and the bottom surface 14 can be easily arranged on the same plane.

That is, the light emitting device 100 can be easily obtained, in which the reflectance is improved by applying plating on the lead frame 20 and/or the lead frame 22, and for example as in the embodiment shown in FIG. 2, the upper surfaces 20a, 20b, 20a of the protrusions are in the same plane.

The light emitting devices 100A, 100B can be manufactured in a similar manner. More particularly, the light emitting device 100A can be manufactured with increasing the number of the lead frames and the number of light emitting elements, and further in the manufacturing step of S5: Light Emitting Element Mounting, in addition to the light emitting elements 50, where appropriate, also mounting the elements such as a Zener diode 55. In contrast, the light emitting device 100B can be manufactured without forming a recess in the resin portion 10B in the manufacturing step of Resin Molding, and in the manufacturing step of Sealing which is performed where appropriate, the sealing member 18 is formed with a sealing material instead of inserting a sealing material in the recess.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a package comprising a resin portion and at least two lead frames arranged in the resin portion; and
a light emitting element electrically connected to at least one of the lead frames, and disposed on an element mounting surface of the package;
wherein at least one lead frame comprises at least two protrusions on its upper surface, a resin which forms the element mounting surface is contained between the at least two protrusions;
at least one protrusion has an upper surface exposed from the resin on the element mounting surface;
the light emitting element is disposed on the upper surface of the at least one protrusion, and
wherein at least one of the lead frames has at least two protrusions having upper surfaces exposed from the resin portion at the element mounting surface, and the light emitting element is mounted on one of the two protrusions, and a wire electrically connected to the light emitting element is connected to the other protrusion.

2. The light emitting device according to claim 1, wherein an area of a bottom surface of the light emitting element is 50% to 150% with respect to the area of the upper surface of the at least one protrusion.

3. The light emitting device according to claim 1, wherein a longitudinal length and a lateral length of a bottom surface of the light emitting element are respectively in a range of plus and minus 0.1 mm with respect to a longitudinal length and a lateral length of the upper surface of the at least one protrusion.

4. The light emitting device according, to claim 1, wherein a shape of the upper surface of the at least one protrusion has rounded corners.

5. The light emitting device according to claim 1, wherein the upper surface of the at least one protrusion has a smaller area than a bottom surface of the light emitting element, and wherein the light emitting element is mounted with its circumference outside of a circumference of the upper surface of the at least one protrusion.

6. The light emitting device according to claim 1, wherein an area of the upper surface of the at least one protrusion is equal to an area of a bottom surface of the light emitting device.

7. The light emitting device according to claim 1, wherein the upper surface of the at least one protrusion protrudes from a surface of the resin portion.

8. The light emitting device according to claim 1, wherein a metal layer is disposed on the upper surface of the at least one protrusion.

9. The light emitting device according to claim 8, wherein the metal layer is disposed on only the upper surface of the at least one protrusion.

10. A light emitting device comprising:
   a package comprising a resin portion and at least two lead frames arranged in the resin portion; and
   a light emitting element electrically connected to at least one of the lead frames, and disposed on an element mounting surface of the package;
   wherein at least one lead frame comprises at least three protrusions on its upper surface, a resin which terms the element mounting surface is contained between the at least three protrusions;
   the resin portion includes a recess;
   a first one of the at least three protrusions is located under a bottom surface of the recess and an upper surface of the first one of the at least three protrusions is exposed from the resin, the light emitting element being disposed on the upper surface of the first one of the at least three protrusions;
   a second one of the at least three protrusions is located under the bottom surface of the recess and an upper surface of the second one of the at least three protrusions is exposed from the resin, a wire being connected to the upper surface of the second one of the at least three protrusions; and
   a third one of the at least three protrusions is buried in the resin.

11. The light emitting device according to claim 10, wherein an area of a bottom surface of the light emitting element is 50% to 150% with respect to the area of the upper surface of the first one of the at least three protrusions.

12. The light emitting device according to claim 10, wherein a longitudinal length and a lateral length of a bottom surface of the light emitting element are respectively in a range of plus and minus 0.1 mm with respect to a longitudinal length and a lateral length of the upper surface of the first one of the at least three protrusions.

13. The light emitting device according to claim 10, wherein a shape of the upper surface of the first one of the at least three protrusions has rounded corners.

14. The light emitting device according to claim 10, wherein the upper surface of the first one of the at least three protrusions has a smaller area than a bottom surface of the light emitting element, and wherein the light emitting element is mounted with its circumference outside of a circumference of the upper surface of the first one of the at least three protrusions.

15. The light emitting device according to claim 10, wherein an area of the upper surface of the first one of the at least three protrusions is equal to an area of a bottom surface of the light emitting device.

16. The light emitting device according to claim 10, wherein a metal layer is disposed on the upper surface of the first one and the second one of the at least three protrusions, but is not disposed on an upper surface of the third one of the at least three protrusions.

* * * * *